(12) United States Patent
Huber et al.

(10) Patent No.: US 11,646,553 B2
(45) Date of Patent: May 9, 2023

(54) METHOD FOR INSTALLING A SWITCHING MODULE IN AN ELECTRICAL CABINET, CORRESPONDING INSTALLATION KIT AND SWITCHING MODULE

(71) Applicant: SOCOMEC, Benfeld (FR)

(72) Inventors: Lionel Huber, Epfig (FR); Pierre Biegel, Chatenois (FR); David Bildstein, Plobsheim (FR); Claudio Stammitti, Guelph (CA); Desmond Faria, Richmond Hill (CA)

(73) Assignee: SOCOMEC, Benfeld (FR)

( * ) Notice: Subject to any disclaimer, the term of this patent is extended or adjusted under 35 U.S.C. 154(b) by 0 days.

(21) Appl. No.: 17/798,343

(22) PCT Filed: Apr. 16, 2021

(86) PCT No.: PCT/EP2021/059900
§ 371 (c)(1),
(2) Date: Aug. 9, 2022

(87) PCT Pub. No.: WO2021/223979
PCT Pub. Date: Nov. 11, 2021

(65) Prior Publication Data
US 2023/0046114 A1    Feb. 16, 2023

(30) Foreign Application Priority Data

May 5, 2020    (FR) ........................................ 2004457

(51) Int. Cl.
*H02B 3/00*    (2006.01)
*H02B 1/32*    (2006.01)

(52) U.S. Cl.
CPC ................. *H02B 3/00* (2013.01); *H02B 1/32* (2013.01)

(58) Field of Classification Search
CPC .................................... H02B 1/32; H02B 3/00
See application file for complete search history.

(56) References Cited

U.S. PATENT DOCUMENTS 3,483,338 A     12/1969  Bould et al.
4,265,583 A  *   5/1981  Baird ........................ B66F 9/12
                                                 414/284

(Continued)

FOREIGN PATENT DOCUMENTS

| JP | S58195476 U | 12/1983 |
| JP | S5960805 U | 4/1984 |
| JP | 2003259512 A | 9/2003 |

*Primary Examiner* — Robert J Hoffberg
(74) *Attorney, Agent, or Firm* — Forge IP, PLLC

(57) ABSTRACT

A method for installing a heavy and bulky switching module, in particular a static transfer switch, in an electrical cabinet, by way of an installation kit to make the switching module easily removable and interchangeable, regardless of its size and weight. The electrical cabinet is equipped with the installation kit including at least two support rails, extendable between an extended position outside, and a retracted position inside, the electrical cabinet, and forming two parallel rolling paths. The switching module is equipped with rollers in two parallel rows, arranged to circulate on the rolling paths to enable movement of the switching module relative to the electrical cabinet by pushing and pulling with minimal effort. A raised transport pallet is also used to facilitate handling of the switching module outside of the electrical cabinet by a simple industrial truck, without resorting to a lifting device.

19 Claims, 14 Drawing Sheets

(56) References Cited

U.S. PATENT DOCUMENTS

| | | | | |
|---|---|---|---|---|
| 4,269,285 A * | 5/1981 | Ohkoshi | ............ | H02B 3/00 |
| | | | | 187/244 |
| 4,728,757 A * | 3/1988 | Buxton | ............ | H02B 11/133 |
| | | | | 200/50.21 |
| 5,097,382 A * | 3/1992 | Leach | ............ | H02B 11/127 |
| | | | | 361/615 |
| 6,827,540 B2 * | 12/2004 | Walker | ............ | H02B 3/00 |
| | | | | 414/427 |
| 7,057,123 B1 * | 6/2006 | Jenkins | ............ | H02B 11/133 |
| | | | | 361/609 |
| 9,108,828 B2 * | 8/2015 | Bolde | ............ | B66F 9/141 |
| 9,203,217 B2 * | 12/2015 | Takano | ............ | H05K 7/06 |
| 10,038,311 B2 * | 7/2018 | Kim | ............ | H02B 1/306 |
| 10,079,479 B2 * | 9/2018 | Kim | ............ | H02B 11/127 |
| 11,165,228 B2 * | 11/2021 | Monahan | ............ | H02B 3/00 |
| 2003/0221914 A1 * | 12/2003 | Smith | ............ | H05K 7/1488 |
| | | | | 187/244 |
| 2014/0133070 A1 * | 5/2014 | Yoshikawa | ............ | H02M 7/003 |
| | | | | 361/624 |

\* cited by examiner

METHOD FOR INSTALLING A SWITCHING MODULE IN AN ELECTRICAL CABINET, CORRESPONDING INSTALLATION KIT AND SWITCHING MODULE

TECHNICAL FIELD

The present invention relates to a method for installing a heavy and bulky switching module, in particular a static transfer switch (STS), in an electrical cabinet, an installation kit and a switching module allowing the implementation of said method.

PRIOR ART

The switching modules with to which the present invention is concerned mainly relate to bulky modules (of the order of one cubic meter) and heavy (from 200 to 300 kg, or even up to 500 kg depending on the model), intended for the switching of high powers (current range from 200 to 1800 A). These figures are given for information only and have no limiting effect. These switching modules may be simple switches comprising a current input and a current output, or transfer switches comprising two current inputs and one current output, the two inputs coming from two independent energy sources, a so-called main source and a so-called backup or alternative source. The present invention relates more particularly to transfer switches, better known under the name "Static Transfer System" and under the acronym STS (Static Transfer Switch). Static Transfer Systems (STS) are smart switches that transfer loads to an auxiliary or backup source when the main source fails or is under maintenance for a long period of time. They use power electronics allowing rapid switching from one source to another to guarantee continuity of supply. They thus guarantee flexible maintenance of a site or installation, as well as high availability, even in the event of unavailability of the power supply network. These STS systems are particularly suitable for infrastructures evolving in many sectors such as finance, banking and insurance, the field of health, telecommunications and radio and television broadcasting, industry, power plants, transport, etc.

Traditionally, switch modules of this type are integrated into electrical cabinets during their manufacture. This type of installation is restrictive when it is necessary to carry out maintenance operations and/or to replace a defective module with a new module. Their size and, above all, their weight, a few hundred kilograms, require substantial handling means, in particular lifting gear, traveling cranes, forklifts, stackers or the like, to dismantle the defective module and extract it from the cabinet, to handle it outside the cabinet, then to install the repaired module or a new module and reassemble it in the cabinet. This heavy handling monopolizes several operators and suitable lifting gear, requires several hours of work, and is not without risk for personnel or equipment.

One of the known solutions, described in the publication JP 2003 259512 A, consists in adding rollers under the electrical module to facilitate its movement by pushing and pulling in a transfer plane which extends from the outside to the inside of the electrical cabinet and vice versa. One of the complementary solutions, disclosed in the publications JP S59 60805 U and U.S. Pat. No. 3,483,338 A, consists in providing extendable support rails in the electrical cabinet to create rolling paths extending from the outside to the inside of the cabinet, making it easier to move the electrical module relative to the cabinet. Nevertheless, in all cases and if the electrical module is heavy, prohibiting manual handling as in the publication JP S58 195476 U, resorting to substantial handling means, such as lifting gear, is essential.

Presentation of the Invention:

The present invention aims to overcome these drawbacks by proposing a method for installing a switching module in an electrical cabinet in a removable manner so that it is interchangeable, with the aim of facilitating interventions in the event of breakdown or maintenance, of shortening the intervention time, improving ergonomics, securing the work of operators and ensuring the integrity of the equipment, without having to monopolize several operators, nor substantial handling means such as lifting equipment.

For this purpose, the invention relates to a method of the kind indicated in the preamble, in which said switching module is installed in said electrical cabinet by means of an installation kit in order to make said switching module easily removable and interchangeable, regardless of its size and weight, and avoid the use of a lifting device, in which said electrical cabinet is equipped with said installation kit comprising two extendable support rails between an extended position outside of said electrical cabinet and a retracted position inside said electrical cabinet, said support rails being arranged to form two parallel rolling paths, in which said switching module is equipped with rollers arranged in two parallel rows, designed to circulate on said rolling paths so as to be able to move said switching module from the outside to the inside of said electrical cabinet and vice versa by pushing and pulling with minimal effort, and in which a raised transport pallet forming part of said installation kit is used to handle said switching module outside of said electrical cabinet by means of an industrial truck, so that the rollers of said switching module, when supported by said transport pallet, are positioned substantially at the same level as the rolling paths defined by said support rails to allow the transfer of said switching module by rolling from the transport pallet to the electrical cabinet and vice versa.

Said transport pallet may be fitted with spars, said switching module may be fixed to said spars by means of feet arranged under said switching module between the two rows of rollers, and the height of said spars may be determined depending on the level of installation of said support rails in said electrical cabinet.

In a preferred embodiment of the invention, provision is made in said installation kit for a distal connection pad and a lateral connection pad forming two perpendicular vertical support planes, said connection pads are fixed in said electrical cabinet respectively on a rear face and on one of the inner lateral faces of said electrical cabinet, electrical conductors forming current inputs and outputs are connected thereto, and said switching module is fitted with distal connection terminals and lateral connection terminals forming two perpendicular vertical support planes. Advantageously, said lateral connection pad is fixed on brackets so that it is movable between an initial position corresponding to a position connected with the lateral connection terminals of said switching module, and a retracted position corresponding to a disconnected position of said lateral connection terminals by providing an assembly clearance which allows the displacement of said switching module relative to said electrical cabinet.

Said installation kit may be provided with lateral mounting lugs added to the inner lateral faces of said electrical cabinet, said switching module may be equipped with front mounting lugs, and, when said switching module is in the mounted position in said electrical cabinet, it may be locked in the mounted position by fixing the front mounting lugs to the corresponding lateral mounting lugs provided in the electrical cabinet.

For this purpose, the invention also relates to an installation kit, characterized in that it comprises two support rails arranged to equip said electrical cabinet, said support rails being extendable between an extended position and a retracted position to form two parallel rolling paths for said switching module, and in that it comprises a raised transport pallet arranged to handle said switching module outside of said electrical cabinet by means of an industrial truck, without the need for a lifting device.

Said transport pallet may comprise two spars on which said switching module is intended to be fixed, and said spars may have a height determined according to the level of installation of the support rails in said electrical cabinet.

In a preferred embodiment, the installation kit comprises a distal connection pad and a lateral connection pad forming two perpendicular vertical support planes, said connection pads being arranged to equip said electrical cabinet. Advantageously, said lateral connection pad may be mounted on brackets to be movable between an initial position and a retracted position, separated from each other by an assembly clearance.

The installation kit may further comprise lateral mounting lugs arranged to equip said electrical cabinet and lock said switching module in the mounted position when it is installed in said electrical cabinet.

For this purpose, the invention finally relates to a switching module, characterized in that it comprises rollers arranged in two parallel rows and designed to circulate on rolling paths formed by extendable support rails added in said electrical cabinet, and feet placed under said module and arranged to fix said switching module on a transport pallet, said feet being able to be placed between said rows of rollers.

In a preferred embodiment of the invention, said switching module comprises distal connection terminals and lateral connection terminals projecting from the upper part of said module and arranged to form two perpendicular vertical support planes, said connection terminals being arranged to be connected to the distal and lateral connection pads added in said electrical cabinet when said switching module is installed in said electrical cabinet.

Finally, it may comprise front mounting lugs arranged to be assembled with corresponding lateral mounting lugs added in said electrical cabinet when said switching module is installed in said electrical cabinet.

BRIEF DESCRIPTION OF THE FIGURES

The present invention and its advantages will be better understood in the following description of several embodiments given by way of non-limiting examples, with reference to the appended drawings, in which.

DETAILED DESCRIPTION OF THE INVENTION

Figure 1:
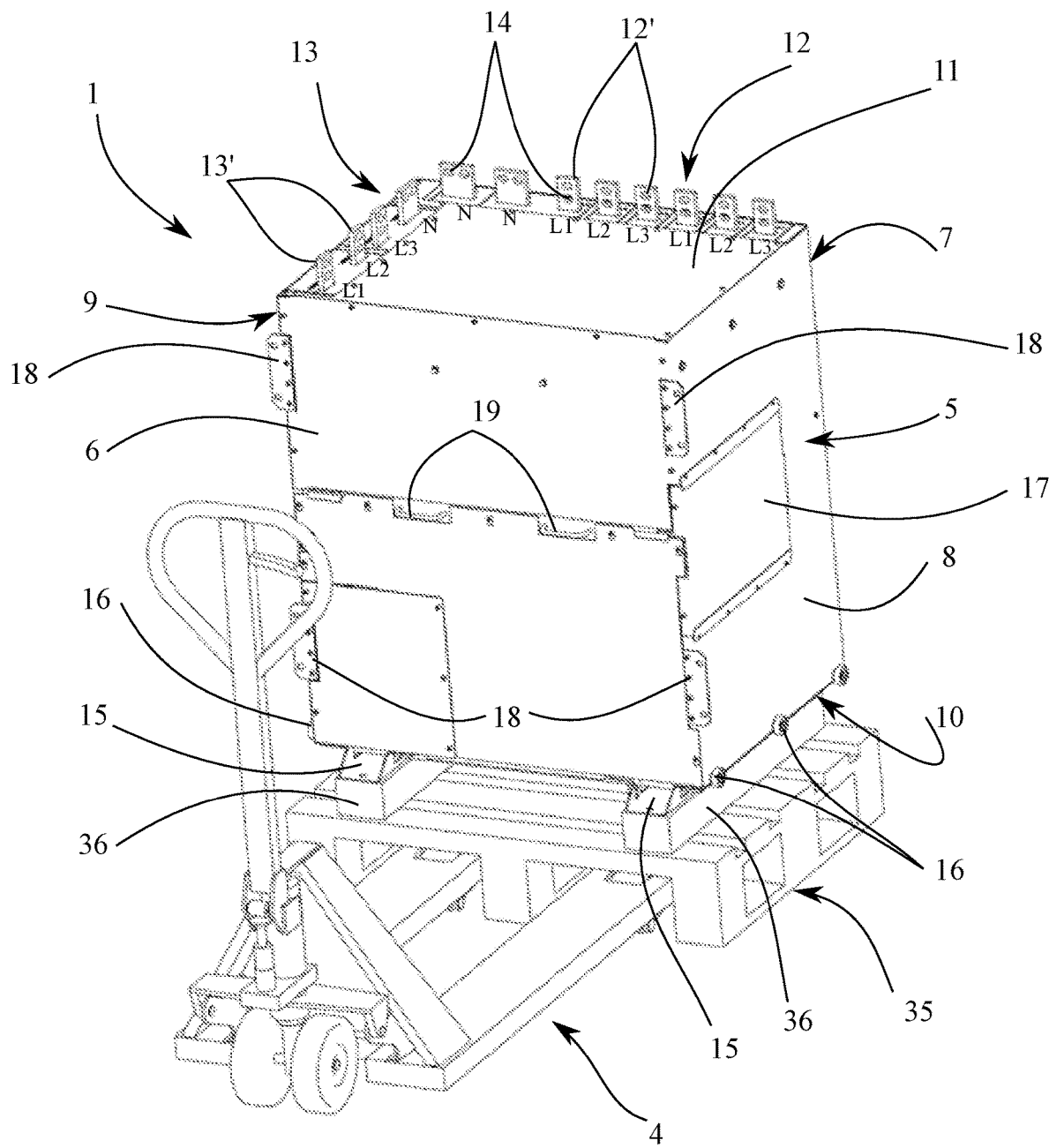
FIG. 1 is a perspective view of a switching module according to the invention fixed on a transport pallet forming part of an installation kit according to the invention.

In the illustrated embodiment, identical elements or parts bear the same reference numbers. Also, terms that have a relative meaning, such as vertical, horizontal, right, left, front, back, above, below, top, bottom, side, transverse, etc. must be interpreted under normal conditions of use of the invention, as shown in the figures.

With reference to the figures, the present invention relates to a method for installing a switching module 1 in an electrical cabinet 2 by means of a specific installation kit 3, allowing to make said switching module 1 easily removable and interchangeable by a single person in less than half an hour and with a simple industrial truck 4, without the need for a lifting device, forklift, stacker or similar.

The switching module 1 according to the invention is a standard module to which some exterior fittings were added which will be described later and which may be attached to any new switching module or one already in service. Since the invention does not encompass the power electronics contained in the module, they are neither shown nor described. The switching module 1 comprises a parallelepipedal box 5 defined by a front face 6, a rear face 7, a right lateral face 8, a left lateral face 9, a lower face 10 and an upper face 11. It comprises distal connection terminals 12 and lateral connection terminals 13, accessible outside the box 5 and arranged in the example shown respectively at the rear face 7 and the left face 9 of the box 5. They are intended to be connected respectively to at least one current input or source and to at least one current load or output. In the example shown, the distal connection terminals 12 are intended to be connected to two current sources, namely a main source and an auxiliary or backup source, being a static transfer module (STS). Obviously, the distribution of the connection terminals 12, 13 may vary depending on the electrical installations. The number of connection terminals 12, 13 depends on whether or not there is a neutral and a ground wire in the electrical installation. In this case, it is a three-phase installation with neutral wire and each current input and output zone has three connection terminals for the three phases of the installation L1, L2, L3 and a connection terminal for neutral N.

In the switching module 1 according to the invention, the connection terminals 12, 13 consist of conductive bars 12', 13', for example made of copper, oriented vertically and projecting perpendicularly from the upper face 11 of the box 5. They are respectively merged in two vertical planes, including a distal vertical plane and a lateral vertical plane which are mutually perpendicular. They further comprise perforations 14 to receive fasteners described below. The switching module 1 according to the invention comprises feet 15 located below the lower face 10 of the box 5. It also comprises rollers 16 arranged in two rows at the base of the right 8 and left 9 lateral faces of the box 5. The wheels 16 are located outside the feet 15 and the box 5. They may be arranged at a different level from that of the feet 15 and, for example, at a lower level. It may include one or more stiffeners 17 on all or part of its faces and, in particular, on each of its right 8 and left 9 lateral faces to give it dimensional rigidity during handling. It further comprises front mounting lugs 18 which extend in the extension of the front face 6 to the right and to the left of the box 5. There are four of them, two in the lower part and two in the upper part of the box 5, this number not being limiting. The switching module 1 is finally equipped with handles 19 arranged on the front face 6 of the box 5, in the middle part, in order to be able to move said module by pushing or pulling.

The electrical cabinet 2 according to the invention is a standard cabinet in which an installation kit 3 has been mounted which will be described later and which may be added to any new electrical cabinet or one already in service. The electrical cabinet 2 comprises at least one parallelepipedal housing 20 for receiving said switching module 1, defined by a front opening 21 closed by a door (not shown), a rear face 22, a right lateral face 23, a left lateral face 24, a lower face 25 and an upper face 26. Since only this housing 20 is of interest for the invention, the other parts of the electrical cabinet 2 are not shown or described. It traditionally comprises electrical conductors (not shown) respectively coming from at least one input or current source, and in the example described from two current sources, namely a main source and an auxiliary or backup source, and to at least one load or current output. Obviously, the number of electrical conductors provided in the housing 20 of the electrical cabinet 2 and the number of connection terminals 12, 13 provided on the switching module 1 are identical.

Figure 2:
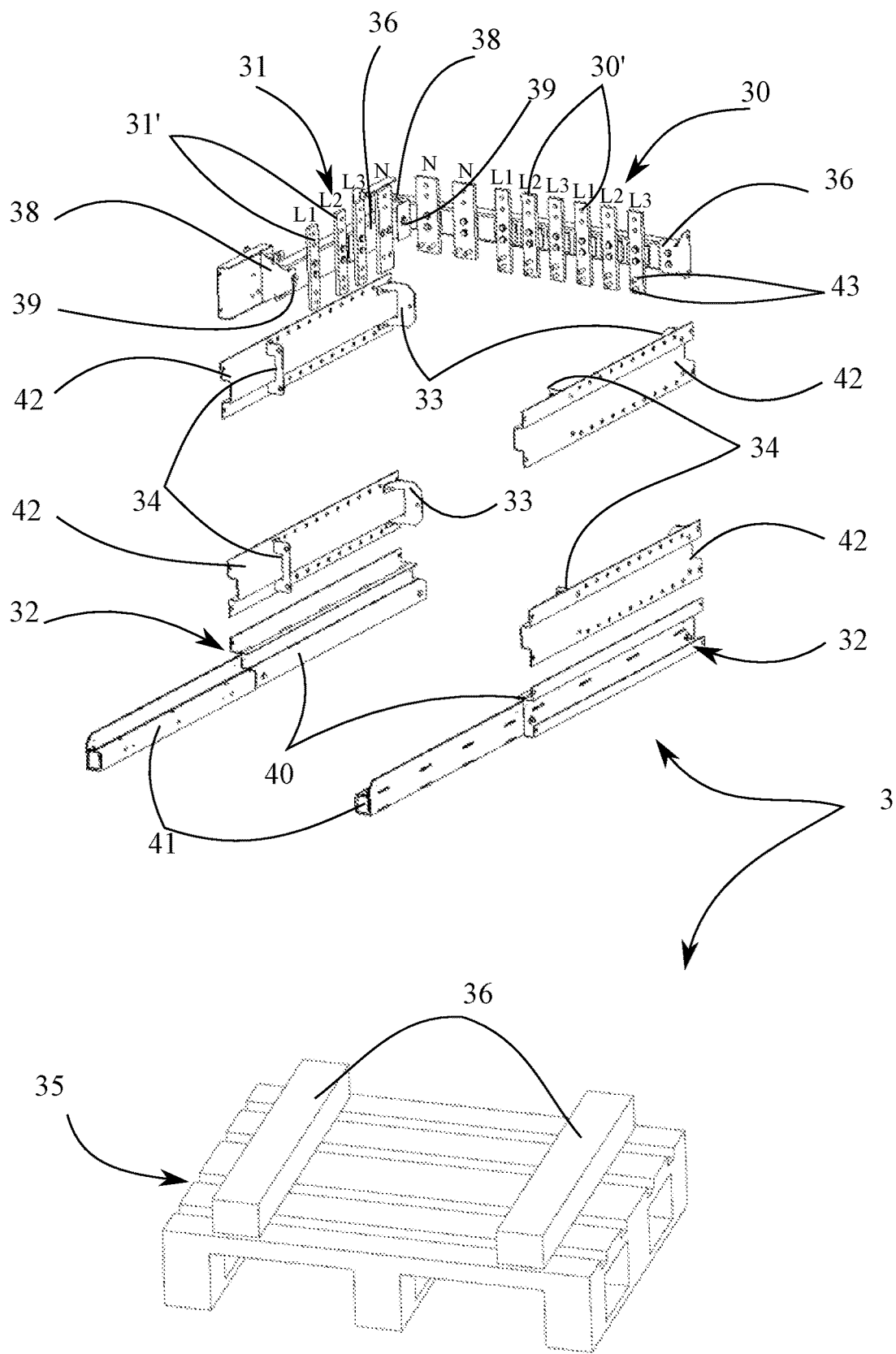
FIG. 2 is an exploded perspective view of an installation kit according to the invention.
Figure 3:
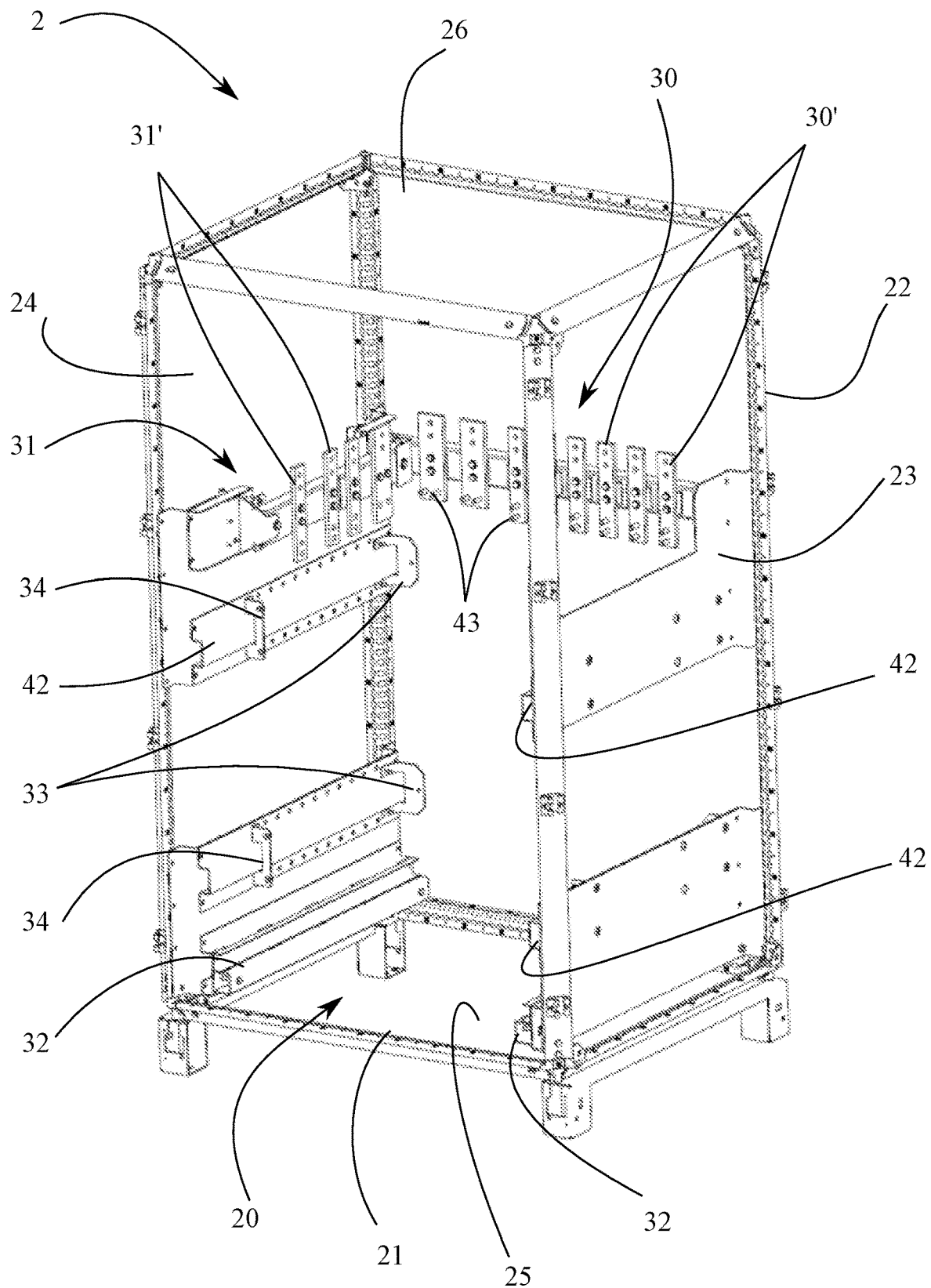
FIG. 3 is a perspective view of an electrical cabinet fitted with part of the installation kit illustrated in FIG. 2.

With reference to FIGS. 2 and 3, the installation kit 3 according to the invention comprises:
 a distal connection pad 30 for the current inputs,
 a lateral connection pad 31 for the current outputs,
 extendable support rails 32,
 end stops 33 and lateral mounting lugs 34,
 and a raised transport pallet 35.

The transport pallet 35 according to the invention is a standard pallet which has been raised by a special arrangement, in accordance with FIGS. 1 and 2, to transport the switching module 1 in a safe manner at a determined height. In the example shown, it comprises two parallel spars 36, added to the receiving tray of the transport pallet 35, to receive the feet 15 of the switching module 1. Any other raising system may be suitable, such as raised tray or a trellis-like support. The feet 15 are fixed to said spars 36 by screws or any removable fastener. The height of the spars 36 is determined according to the height of installation of the switching module 1 in the electrical cabinet 2 to avoid resorting to a lifting device or forklift, other than an industrial truck 4 whose lift height is generally limited to 200 mm. Like other transport pallets, it can be moved effortlessly by an industrial truck 4 such as a pallet truck. Obviously, the transport pallet 35 may be specially designed at the desired height.

The other elements of the installation kit 3 are placed in the housing 20 provided for this purpose in the electrical cabinet 2 in accordance with FIG. 3.

The connection pads 30 and 31 each comprise at least one insulating support profile 37 on which are fixed conductive bars 30', 31', perpendicular to said profile 37. Each conductive bar 30', 31' is connected to an electrical conductor (not shown) of a source of energy or a load by any suitable fixing means, such as a lug and a screw. The distal connection pad 30 dedicated to the current inputs is positioned against or close to the rear face 22 of the housing 20, such that the corresponding conductive bars 30' extend vertically and merge in the same distal vertical plane. And the lateral connection pad 31 dedicated to the current outputs is positioned against or close to the left lateral face 24 of the housing 20, so that the conductive bars 31' extend vertically and merge in the same lateral vertical plane, perpendicular to the distal vertical plane.

Figure 9:
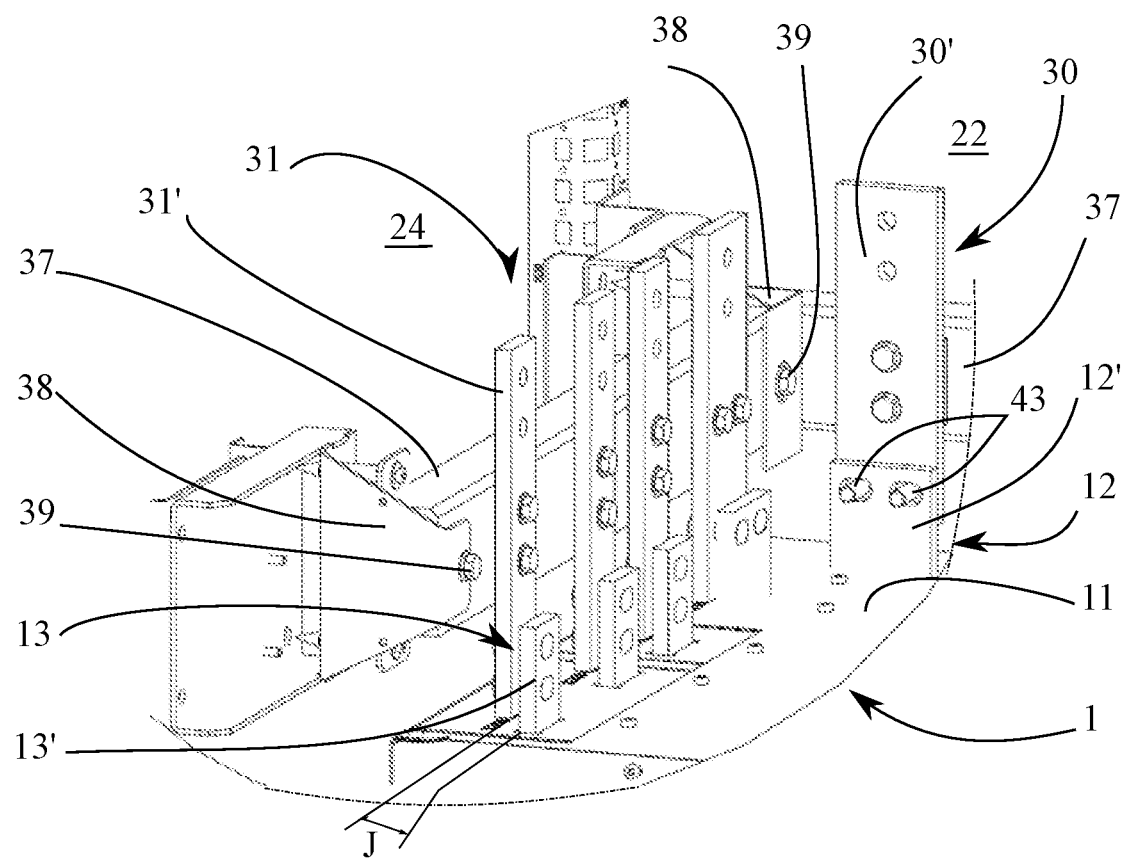
FIG. 9 is a detail view showing a step prior to the connection between lateral connection terminals of the switching module and lateral connection pads of the electrical cabinet.
Figure 10:
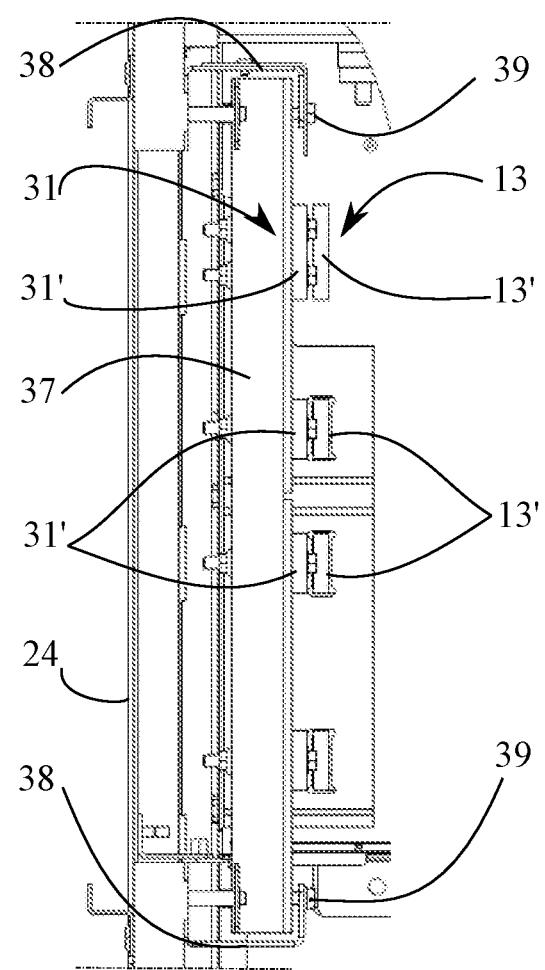
FIG. 10 is a top view of FIG. 9.
Figure 11:
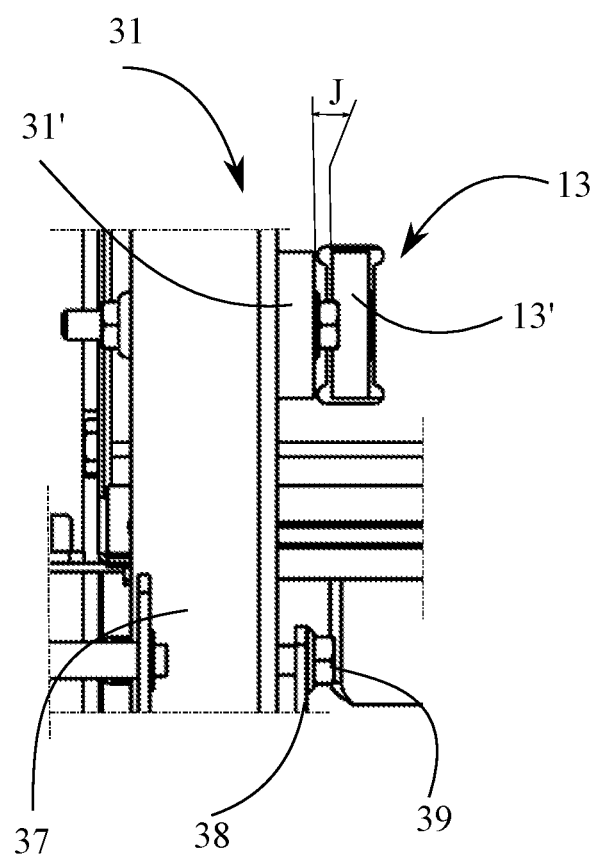
FIG. 11 is a detail view of FIG. 10 of a connection terminal and a connection pad remote from an assembly clearance.
Figure 12:
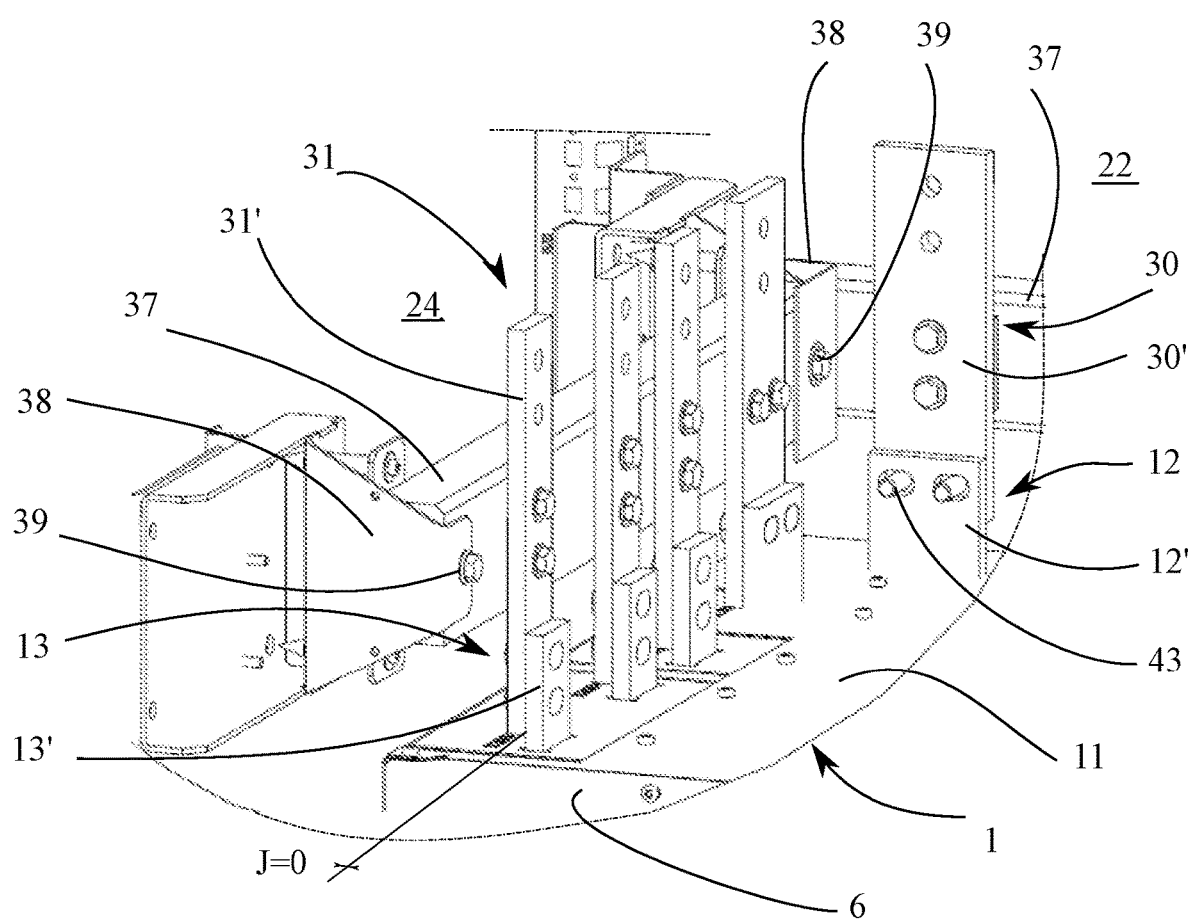
FIG. 12 is a detail view similar to FIG. 9 showing the connection step between the lateral connection terminals of the switching module and the lateral connection pads of the electrical cabinet.
Figure 13:
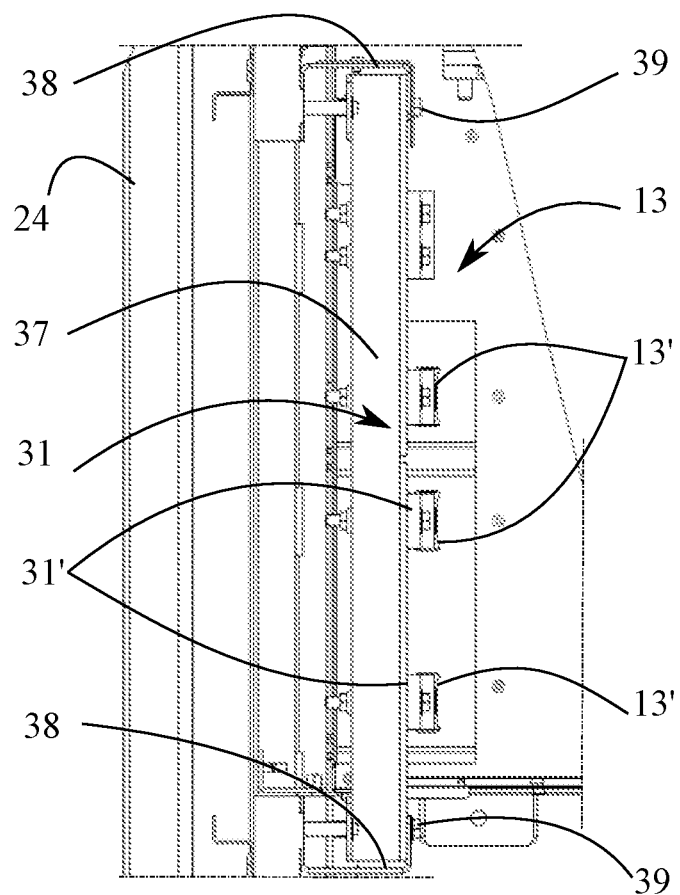
Figure 14:
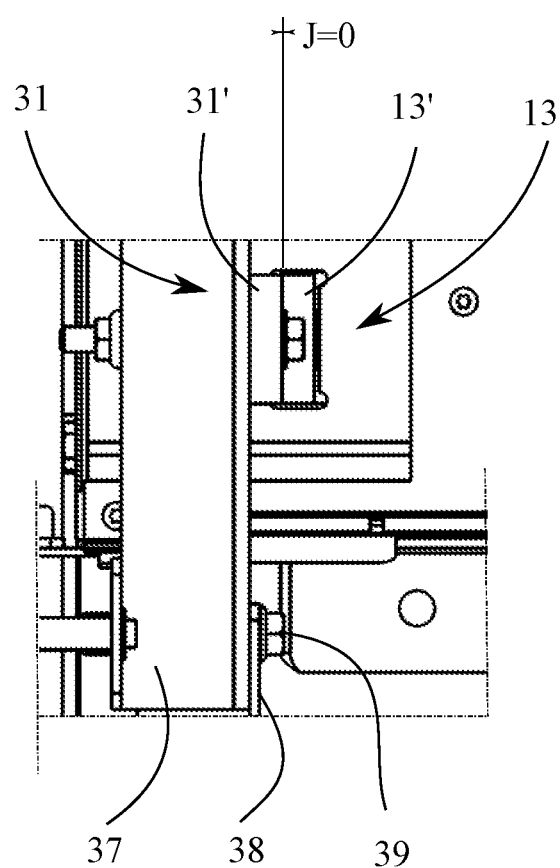
FIG. 14 is a detail view of FIG. 13 of a connection terminal and a connection pad connected to each other.

In addition, the lateral connection pad 31 is fixed to two brackets 38 by fixing screws 39 which make it possible to move said lateral connection pad 31 between an initial position and a retracted position generating an assembly clearance J. In the initial position (FIG. 12 to 14), the fixing screws 39 are tightened and the lateral connection pad 31 is moved forward to be in contact with the corresponding lateral connection terminals 13 of the switching module 1, and close the electrical circuit. In the retracted position (FIG. 9 to 11), the fixing screws 39 are loosened, allowing the operator to push the lateral connection pad 31 to the left, move it away from the corresponding lateral connection terminals 13 of the switching module 1, open the electrical circuit and provide an assembly clearance J, allowing movement of the switching module 1 relative to the electrical cabinet 2 without obstacle. Obviously, any other means making it possible to move the lateral connection pad 31 between its initial and retracted positions may be suitable. A spring member may also be added in the brackets 38 under the fixing screws 39 to automatically move the lateral connection pad 31 from its initial position to its retracted position, or vice versa, depending on the tightening and loosening of said fixing screws 39.

Figure 4:
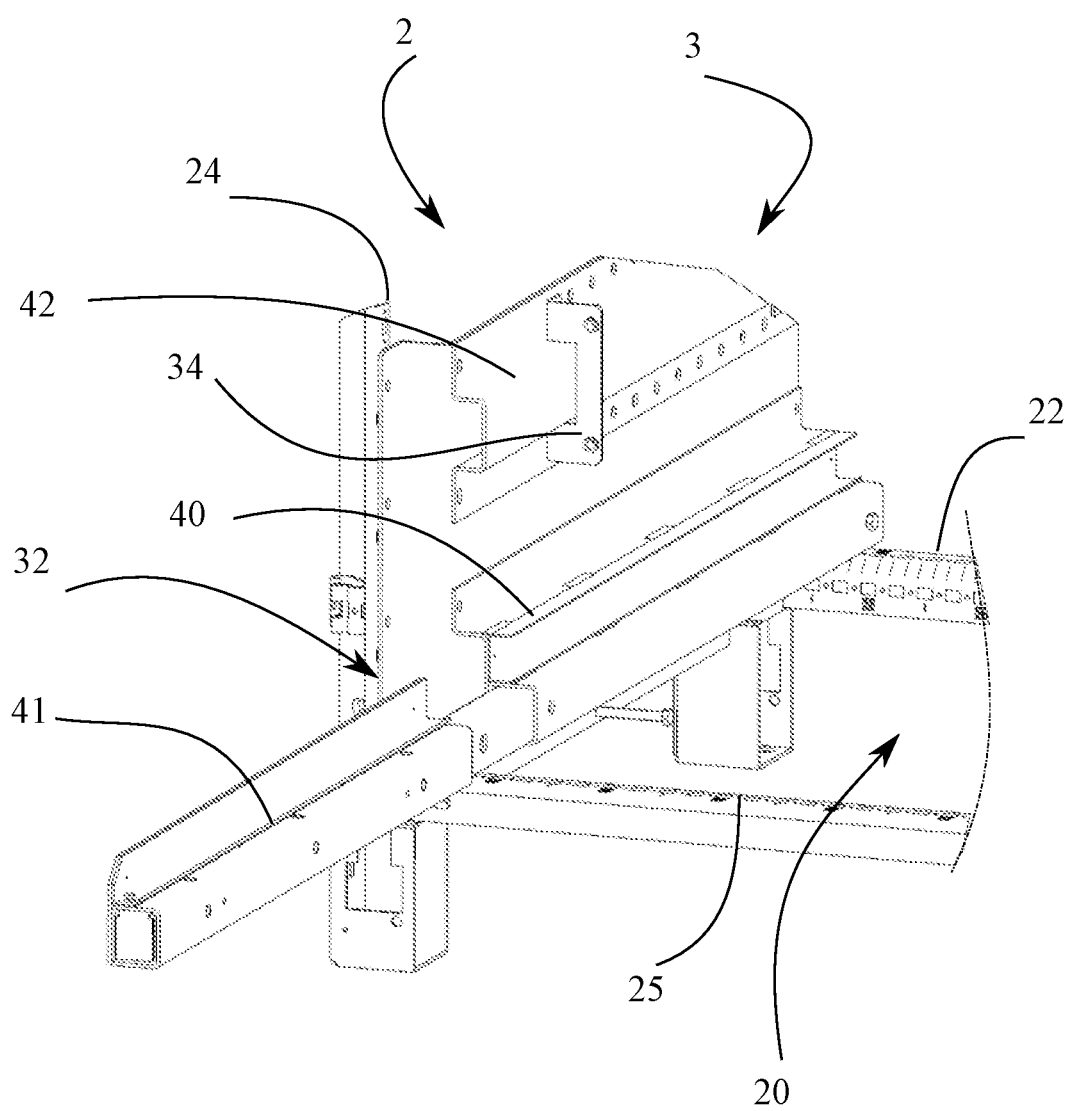
FIG. 4 is a detail view of an extendable support rail from the installation kit mounted in the electrical cabinet of FIG. 3, in the extended position.

There are two extendable support rails 32 in the example shown which are attached to the lower part of the housing 20 provided in the electrical cabinet 2, on its right 23 and left 24 lateral faces. They are arranged in opposition and parallel to each other to form two rolling paths on which the rollers 16 of the switching module 1 can circulate during its movements relative to said cabinet. Each support rail 32 comprises a fixed part 40 and a movable part 41 which can slide relative to the fixed part 40. The fixed part 40 extends over the width of said lateral faces 23, 24, corresponding to the depth of the housing 20. And the movable part 41 can slide between a retracted position (FIG. 3), in which it is entirely housed in the fixed part 40, and an extended position (FIGS. 2, 4 and 5) in which it projects from the fixed part and extends outside the housing 20, and outside the electrical cabinet 2. The movable part 41 of the support rail 32 comprises an L-shaped section to laterally guide said rollers 16 of the switching module 1. The fixed part 40 of the support rail 32 comprises a C-shaped section to laterally and vertically guide said rollers 16. The support rails 32 comprise, between the fixed part 40 and the movable part 41, a linear guide with ball and roller bearings according to the load requirements.

The end stops 33 and the lateral mounting lugs 34 are, in the example shown, fixed to sections 42 attached to the right 23 and left 24 lateral faces of the housing 20 provided in the electrical cabinet 2. There are four sections 42, distributed two by two in the lower part and in the upper part of the housing 20, in opposition and parallel to each other. There are four end stops 33 which are positioned in the bottom of the housing 20, close to the rear face 22. Their function is to stop the switching module 1 when it is introduced into the electrical cabinet 2 and to define the mounted position of said module in which the distal connection terminals 12 are in electrical contact with the distal connection pad 30. There are four lateral mounting lugs 34 which are positioned at the front of the housing 20, at a distance from the end stops 33 corresponding to the depth of the switching module 1. Their function is to fix the switching module 1 through its front mounting lugs 18 to the electrical cabinet 2 and to prevent any accidental relative displacement of said module with respect to the cabinet, particularly in the event of an earthquake. Obviously, the end stops 33 and the lateral mounting lugs 34 may have other shapes, and be differently fixed and/or distributed in the electrical cabinet 2, insofar as they are compatible with the switching module 1.

The installation method according to the invention consists in equipping the housing 20 of an electrical cabinet 2 by means of an installation kit 3 according to the invention, respecting heights and locations determined with respect to the switching module 1 to be installed (FIG. 3). When installed, the distal 30 and front 31 connection pads must be connected to the corresponding electrical conductors (not shown) provided in the electrical cabinet 2.

Figure 5:
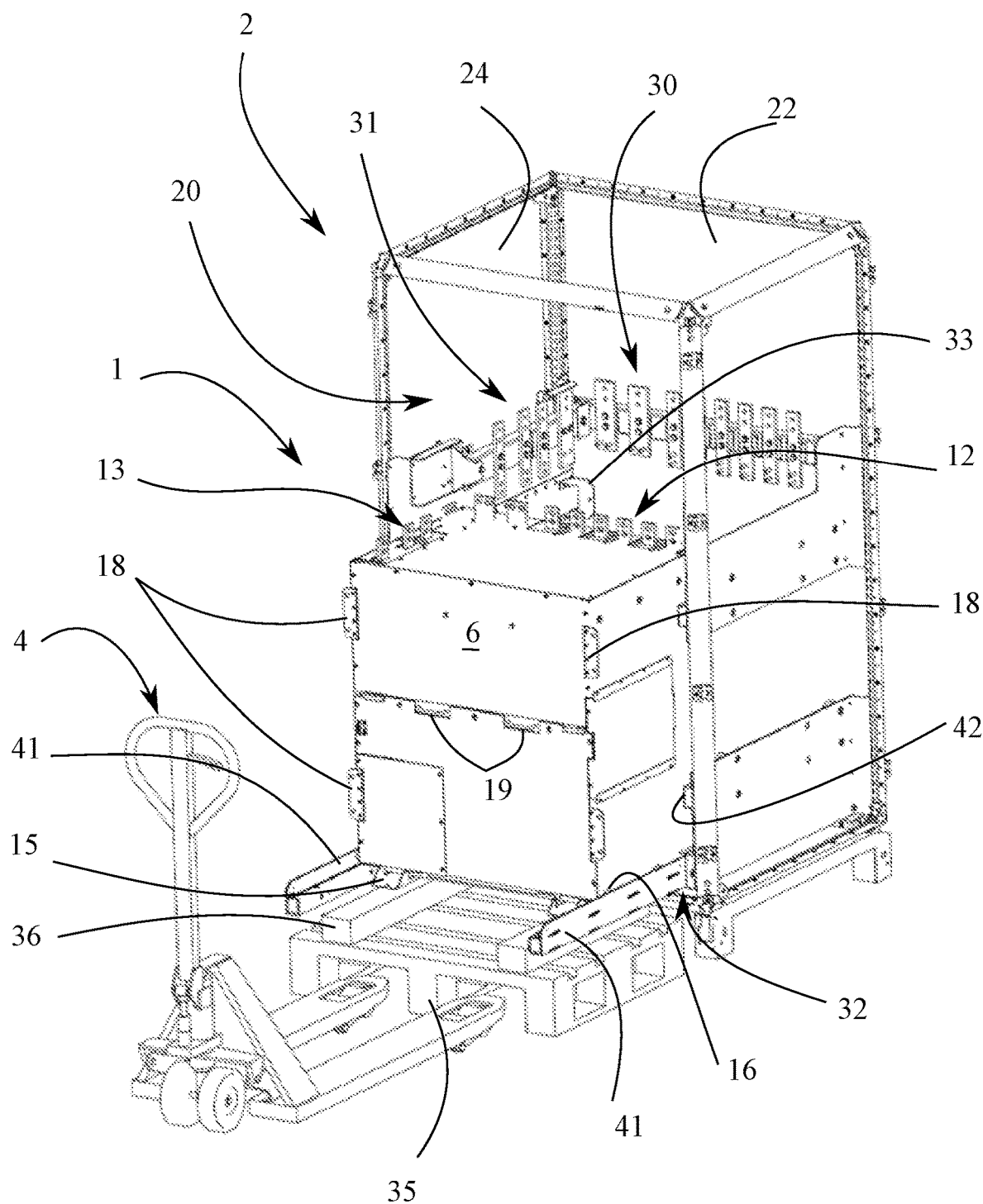
FIG. 5 is a perspective view illustrating a step of the installation method according to the invention, in which the switching module is transferred from the transport pallet to the electrical cabinet.
Figure 6:
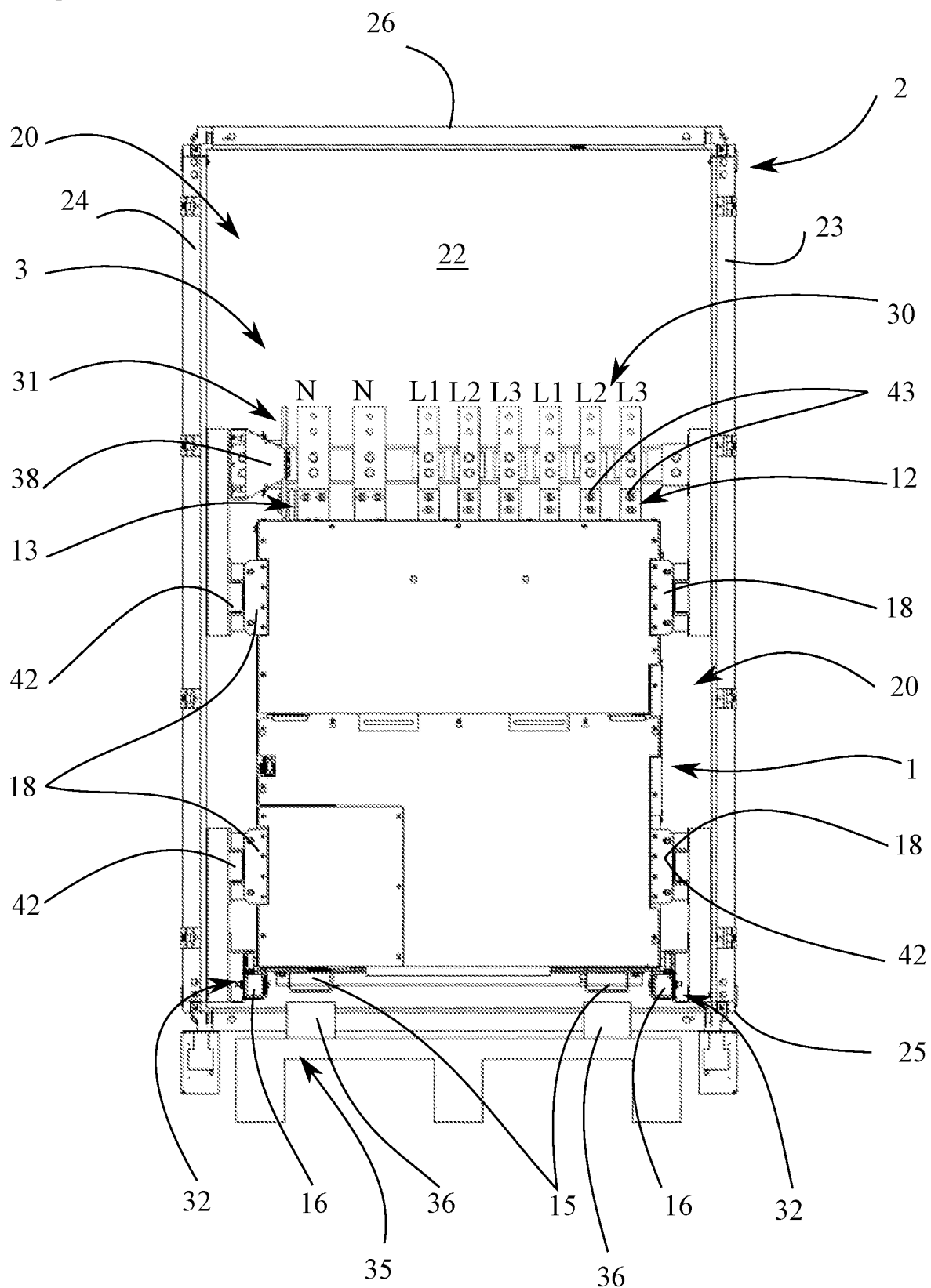
FIG. 6 is a front view of the electrical cabinet in which the switching module was introduced at the end of the step of FIG. 5.
Figure 7:
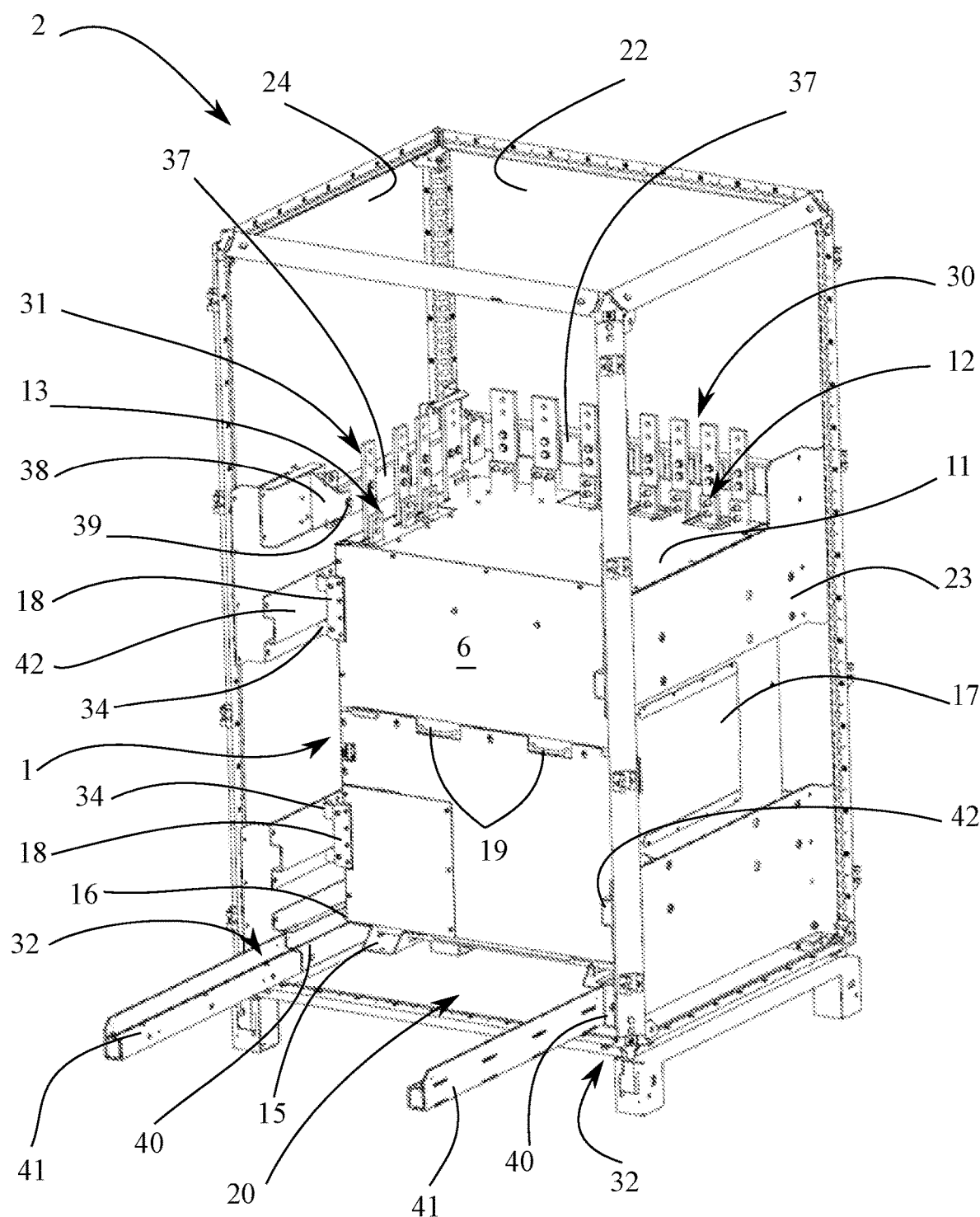
FIG. 7 is a perspective view of FIG. 6, showing the extendable support rails in the extended position, and the transport pallet removed.
Figure 8:
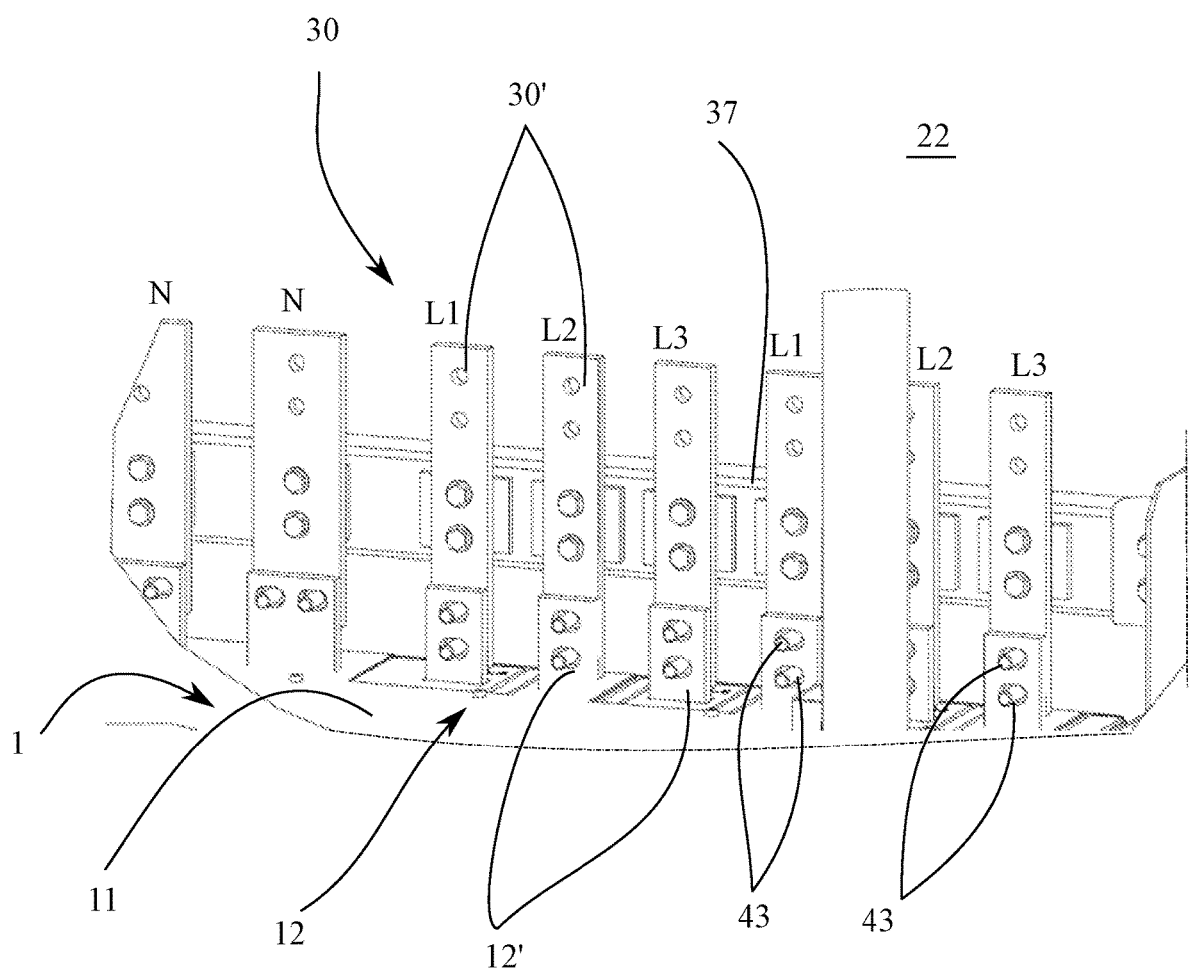
FIG. 8 is a detail view showing a connection step between rear connection terminals of the switching module and rear connection pads of the electrical cabinet.

In reference to FIG. 1, the switching module 1 is positioned on a transport pallet 35 according to the invention. The feet 15 of the switching module 1 may be fixed on the corresponding spars 36 (FIG. 1). The "switching module 1 and transport pallet 35" assembly thus constituted forms a rigid whole which can be handled in complete safety by a traditional industrial truck 4 equipped with forks. The forks of the industrial truck 4 make it possible to pick up the transport pallet 35 and to raise it slightly (lifting height less than or equal to 200 mm) in order to be able to move said switching module 1 and bring it in front of the housing 20 provided in the electrical cabinet 2 (FIG. 5). Previously, the mobile part 41 of the support rails 32 has been moved from its retracted position to its extended position, allowing the rollers 16 of the switching module 1 to be accommodated outside the electrical cabinet 2. Thanks to the raised transport pallet 35, the rollers 16 of the switching module 1 are positioned substantially at the same level as the rolling paths defined by the support rails 32. The forks of the industrial truck 4 are lowered to deposit the switching module 1 on the support rails 32 through its rollers 16. The fixing screws of the feet 15 of the switching module 1 are unscrewed and removed to separate the switching module 1 from the transport pallet 35, the latter being removed by means of said industrial truck 4. The switching module 1 then rests exclusively on the movable part 41 of the support rails 32 (FIGS. 6 and 7). It can then be simply pushed towards the back of the housing 20 by exerting a minimal pushing force since it rolls on the rolling paths of the moving parts 41, then those of the fixed parts 40 of the support rails 32. Previously, the fastening screws 39 of the lateral connection pad 31 on the brackets 38 were unscrewed to move said pad from its initial position to its retracted position in order to provide an assembly clearance J, allowing the introduction of said switching module 1 into the electrical cabinet 2. When said switching module 1 reaches its mounted position, defined by the end stops 33, it can be locked in position, by assembling, with fixing screws, its front mounting lugs 18 superimposed on the lateral mounting lugs 34 provided in the housing 20. In this mounted position, the distal connection terminals 12 of the switching module 1 are in plane contact with the distal connection pad 30 which equips the electrical cabinet 2. The corresponding conductive bars 12' and 30' are superimposed, in electrical contact with each other, and may be fixed by any appropriate means, such as nuts tightened on studs 43 provided on the conductive bars 30' of the distal connection pad 30. The fixing screws 39, which hold the lateral connection pad 31 on its brackets 38, may be screwed to return said pad to its initial position, bringing the lateral connection pad 31 into plane contact with the corresponding connection terminals 13 of the switching module 1. The corresponding conductive bars 13' and 31' are superimposed, in electrical contact with each other and may be fixed by any suitable means, such as nuts tightened on studs 43 provided on the conductive bars 31' of the lateral connection pad 31. Any other removable electrical connection means may be suitable. Therefore, the switching module 1 is installed and electrically connected in an electrical cabinet 2, simply, quickly, effortlessly, in a short time by a single operator, in complete safety, with a simple industrial truck 4 with forks, and without using a lifting device, forklift or other. To perform a maintenance operation on said switching module 1, it is necessary to proceed in reverse in order to electrically disconnect the switching module 1 from the electrical cabinet 2, move the lateral connection pad 31 from its initial position to its retracted position, move the moving parts 41 of the support rails 32 from their retracted position to their extended position, move the switching module 1 by traction to make it roll on the rolling paths of the support rails 32, extract it from its housing 20 and bring it outside the electrical cabinet 2, position a transport pallet 35 raised by means of an industrial truck 4 under the switching module 1, slightly raise the transport pallet 35 to come into contact with the feet 15, fix the feet 15 on the spars 36, move the industrial truck 4 back until the rollers 16 leave the support rails 32, and transport the switching module 1 to a maintenance area or other. The installation method according to the invention makes it possible to access, repair or replace the switching module 1 in an optimized and ergonomic manner, with a simple industrial truck.

The present invention is, obviously, not limited to the embodiment described but extends to any modification and variant obvious to a person skilled in the art within the limits of the appended claims.

The invention claimed is:

1. A method for installing a switching module in an electrical cabinet, wherein said switching module is installed in said electrical cabinet by way of an installation kit to make said switching module removable and interchangeable, regardless of a size and a weight of said switching module, and avoid a need for a lifting device, wherein said electrical cabinet is equipped with said installation kit comprising two support rails, extendable between an extended position outside of said electrical cabinet and a retracted position inside said electrical cabinet, said support rails being arranged to form two parallel rolling paths, wherein said switching module is equipped with rollers arranged in two parallel rows, configured to roll on said two parallel rolling paths so as to be able to move said switching module from the outside to the inside of said electrical cabinet, and vice versa, by pushing and pulling, and wherein a raised transport pallet, forming part of said installation kit, is used to handle said switching module outside said electrical cabinet by means of an industrial truck, so that the rollers of said switching module, when supported by said raised transport pallet, are positioned substantially at a same level as the two parallel roller paths defined by said support rails in order to allow a transfer of said switching module by rolling said switching module from the raised transport pallet to the electrical cabinet and vice versa.

2. The installation method according to claim 1, characterized in that said transport pallet is fitted with spars, in that said switching module is fixed on said spars by way of feet arranged under said switching module between two parallel rows of the rollers, and in that a height of said spars is determined according to a level of installation of said support rails in said electrical cabinet.

3. The installation method according to claim 1, characterized in that provision is made in said installation kit for a distal connection pad and a lateral connection pad forming two perpendicular first vertical support planes, in that said distal and lateral connection pads are fixed in said electrical cabinet respectively on a rear face and on one of two or more inner lateral faces of said electrical cabinet, in that electrical conductors are connected to said distal and lateral connection pads forming current inputs and outputs, in that said switching module is fitted with distal connection terminals and lateral connection terminals forming two perpendicular second vertical support planes, and in that said lateral connection pad is fixed on brackets so that said lateral connection pad is movable between an initial position corresponding to a position connected with the lateral connection terminals of said switching module, and a retracted position corresponding to a disconnected position of said lateral connection terminals by providing an assembly clearance which allows movement of said switching module relative to said electrical cabinet.

4. The installation method according to claim 1, characterized in that provision is made in said installation kit for lateral mounting lugs added to the inner lateral faces of said electrical cabinet, in that said switching module is fitted with front mounting lugs, and in that, when said switching module is in the mounted position in said electrical cabinet, said switching module is locked in the mounted position, by fixing each of the front mounting lugs on a corresponding one of the lateral mounting lugs provided in the electrical cabinet.

5. The installation method of claim 1, wherein said switching module comprises a static transfer switch.

6. An installation kit of a switching module in an electrical cabinet characterized in that said installation kit allows implementation of the installation method according to claim 1, in that said installation kit comprises said two support rails arranged to equip said electrical cabinet, said support rails being extendable between said extended position and said retracted position to form said two parallel rolling paths for said switching module, and in that said installation kit further comprises said raised transport pallet, arranged to handle said switching module outside of said electrical cabinet by way of an industrial truck, without resorting to said lifting device, so that the rollers of the switching module are positioned substantially at said same level as the rolling paths defined by the support rails.

7. The installation kit of claim 6, wherein said switching module comprises a static transfer switch.

8. An installation kit of a switching module in an electrical cabinet characterized in that said installation kit allows implementation of the installation method according to claim 2, in that said installation kit comprises said two support rails arranged to equip said electrical cabinet, said support rails being extendable between said extended position and said retracted position to form said two parallel rolling paths for said switching module, and in that said installation kit further comprises said raised transport pallet, arranged to handle said switching module outside of said electrical cabinet by way of an industrial truck, without resorting to said lifting device, so that the rollers of the switching module are positioned substantially at said same level as the rolling paths defined by the support rails, wherein said transport pallet comprises said two spars on which said switching module is adapted to be fixed, and in that said spars have said height determined according to the installation level of the support rails in said electrical cabinet.

9. The installation kit of claim 8, wherein said switching module comprises a static transfer switch.

10. An installation kit of a switching module in an electrical cabinet characterized in that said installation kit allows implementation of the installation method according to claim 3, in that said installation kit comprises said two support rails arranged to equip said electrical cabinet, said support rails being extendable between said extended position and said retracted position to form said two parallel rolling paths for said switching module, and in that said installation kit further comprises said raised transport pallet, arranged to handle said switching module outside of said electrical cabinet by way of an industrial truck, without resorting to said lifting device, so that the rollers of the switching module are positioned substantially at said same level as the rolling paths defined by the support rails, wherein the installation kit further comprises said distal connection pad and said lateral connection pad forming said two perpendicular first vertical support planes, said distal and lateral connection pads being arranged to equip said electrical cabinet, and wherein said lateral connection pad is mounted on said brackets so as to be movable between said initial position and said retracted position, separated from each other by said assembly clearance.

11. The installation kit of claim 10, wherein said switching module comprises a static transfer switch.

12. An installation kit of a switching module in an electrical cabinet characterized in that said installation kit allows implementation of the installation method according to claim 4, in that said installation kit comprises said two support rails arranged to equip said electrical cabinet, said support rails being extendable between said extended position and said retracted position to form said two parallel rolling paths for said switching module, and in that said installation kit further comprises said raised transport pallet, arranged to handle said switching module outside of said electrical cabinet by way of an industrial truck, without resorting to said lifting device, so that the rollers of the switching module are positioned substantially at said same level as the rolling paths defined by the support rails, wherein the installation kit further comprises said lateral mounting lugs arranged to equip said electrical cabinet and lock said switching module in the mounted position when installed in said electrical cabinet.

13. The installation kit of claim 12, wherein said switching module comprises a static transfer switch.

14. A switching module arranged to be installed in an electrical cabinett allowing an implementation of the installation method according to claim 2, said switching module comprising said rollers arranged in said two parallel rows and configured to roll on said rolling paths formed by said two support rails extendable from said electrical cabinet, and said feet arranged under said switching module and configured to fix said switching module on said raised transport pallet so that the rollers of said switching module are positioned substantially at the same level as the rolling paths defined by said two support rails, said feet being arranged between said two parallel rows of rollers.

15. The switching module of claim 14, wherein said switching module comprises a static transfer switch.

16. A switching module arranged to be installed in an electrical cabinet allowing an implementation of the installation method according to claim 3, said switching module comprising said rollers arranged in said two parallel rows and configured to roll on said rolling paths formed by said two support rails extendable from said electrical cabinet, and said feet arranged under said switching module and configured to fix said switching module on said raised transport pallet so that the rollers of said switching module are positioned substantially at the same level as the rolling paths defined by said two support rails, said feet being arranged between said two parallel rows of rollers, wherein the switching module further comprises distal connection terminals and lateral connection terminals projecting in the upper part of said switching module and arranged to form two perpendicular second vertical support planes, said distal and lateral connection terminals being arranged to be connected to distal and lateral connection pads added in said electrical cabinet when said switching module is installed in said electrical cabinet.

17. The switching module of claim 16, wherein said switching module comprises a static transfer switch.

18. A switching module arranged to be installed in an electrical cabinet allowing an implementation of the installation method according to claim 4, said switching module comprising said rollers arranged in said two parallel rows and configured to roll on said rolling paths formed by said two support rails extendable from said electrical cabinet, and said feet arranged under said switching module and configured to fix said switching module on said raised transport pallet so that the rollers of said switching module are positioned substantially at the same level as the rolling paths defined by said two support rails, said feet being arranged between said two parallel rows of rollers, wherein the switching module further comprises each of said front mounting lugs arranged to be assembled with the corresponding one of the lateral mounting lugs added in said electrical cabinet when said switching module is installed in said electrical cabinet.

19. The switching module of claim 18, wherein said switching module comprises a static transfer switch.

\* \* \* \* \*